(12) United States Patent
Liu et al.

(10) Patent No.: US 7,291,863 B2
(45) Date of Patent: Nov. 6, 2007

(54) LIGHT EMITTING DIODE STRUCTURE

(75) Inventors: Cheng-Yi Liu, Taoyuan (TW); Yuan-Tai Lai, Taipei (TW); Shen-Jie Wang, Taipei (TW)

(73) Assignee: National Central University, Taoyuan (TW)

( * ) Notice: Subject to any disclaimer, the term of this patent is extended or adjusted under 35 U.S.C. 154(b) by 9 days.

(21) Appl. No.: 11/163,220

(22) Filed: Oct. 11, 2005

(65) Prior Publication Data
US 2006/0102925 A1    May 18, 2006

(30) Foreign Application Priority Data
Nov. 12, 2004   (TW) .............................. 93134608 A (51) Int. Cl.
*H01L 29/205* (2006.01)
*H01L 33/00* (2006.01)
(52) U.S. Cl. ................... 257/91; 257/99; 257/103; 257/E33.002; 257/E33.006; 257/E33.014
(58) Field of Classification Search ........... 257/79–103
See application file for complete search history.

(56) References Cited

U.S. PATENT DOCUMENTS

| | | | | |
|---|---|---|---|---|
| 2003/0047741 A1* | 3/2003 | Hata et al. | ..................... | 257/83 |
| 2005/0194606 A1* | 9/2005 | Oohata | ........................ | 257/99 |
| 2005/0247946 A1* | 11/2005 | Shin | ............................ | 257/88 |
| 2005/0258436 A1* | 11/2005 | Arai | ............................. | 257/81 |
| 2006/0145159 A1* | 7/2006 | Yokoyama et al. | ............ | 257/72 |

\* cited by examiner

*Primary Examiner*—Ngân V. Ngô
(74) *Attorney, Agent, or Firm*—Jianq Chyun IP Office (57) ABSTRACT

A LED structure including an epitaxy substrate, a semiconductor layer, a first bonding pad and a second bonding pad, is provided. The epitaxy substrate has a through hole and the semiconductor layer is disposed on the epitaxy substrate. The semiconductor layer includes a first type doped semiconductor layer, a light-emitting layer and a second type doped semiconductor layer. The first type doped semiconductor layer is disposed on the epitaxy substrate, while the light-emitting layer is disposed between the first type and second type doped semiconductor layers. The first bonding pad is disposed in the through hole and electrically connected to the first type doped semiconductor layer, while the second bonding pad is disposed on the second type doped semiconductor layer.

21 Claims, 6 Drawing Sheets

FIG. 5C

LIGHT EMITTING DIODE STRUCTURE

CROSS-REFERENCE TO RELATED APPLICATION

This application claims the priority benefit of Taiwan application serial no. 93134608, filed on Nov. 12, 2004. All disclosure of the Taiwan application is incorporated herein by reference.

BACKGROUND OF THE INVENTION

1. Field of Invention

The present invention relates to a diode structure and a manufacturing method thereof, and particularly to a light emitting diode (LED) structure and a manufacturing method thereof.

2. Description of the Related Art

Over the years, LED devices with a cluster of varied GaN (gallium nitride) compounds, such as GaN (gallium nitride), AlGaN (aluminum gallium nitride), InGaN (indium gallium nitride), have caught much attention in semiconductor industry. The above-mentioned group III A nitride belong to a wide-bandgap semiconductor material family, whose light-wavelengths range from ultraviolet to red light, almost covering the entire visual light waveband. Compared with the conventional light bulbs, LEDs have overwhelming advantage, such as small size, longer lifespan, low driving voltage/current, break-resistance, no mercury (no pollution) and good luminous efficiency (low electricity consumption). With these advantages, LEDs are widely applied in the industry.

Figure 1:
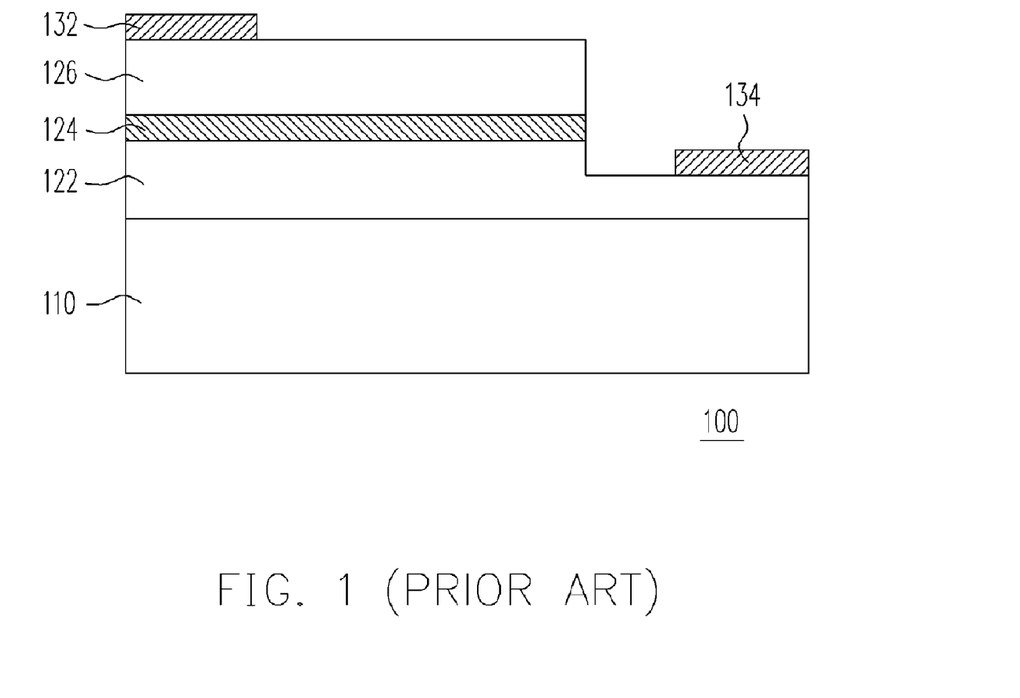
FIG. 1 is a schematic cross-sectional view of a conventional LED.

FIG. 1 is a schematic cross-sectional view of a conventional LED. Referring to FIG. 1, a conventional LED 100 includes an aluminum-oxide substrate 110, a doped semiconductor layer 122, a light-emitting layer 124 and a doped semiconductor layer 126. Wherein, the doped semiconductor layer 122 is disposed on the aluminum-oxide substrate 110, while the light-emitting layer 124 is located on a partial area of the doped semiconductor layer 122, and the doped semiconductor layer 126 is disposed on the light-emitting layer 124. Note that the above-mentioned doped semiconductor layer 122 and the doped semiconductor layer 126 are different types of doped semiconductors. For example, if the doped semiconductor layer 122 is a P-type doped semiconductor, the doped semiconductor layer 126 must be an N-type doped semiconductor.

In more detail, on the doped semiconductor layer 126 and the portion of the doped semiconductor layer 122 uncovered by the doped semiconductor layer 126, a bonding pad 132 and a bonding pad 134 are usually disposed, respectively. The bonding pads 132 and 134 are made of metal. According to the prior art, a conventional LED is electrically connected to a circuit board or other carriers in a wire-bonding technology or flip-chip bonding technology, wherein the bonding pads 132 and 134 serve as a medium for connecting the LED 100 to the circuit board or other carrier. Besides, there is another conventional LED, which is described in the following with reference to FIG. 2.

Figure 2:
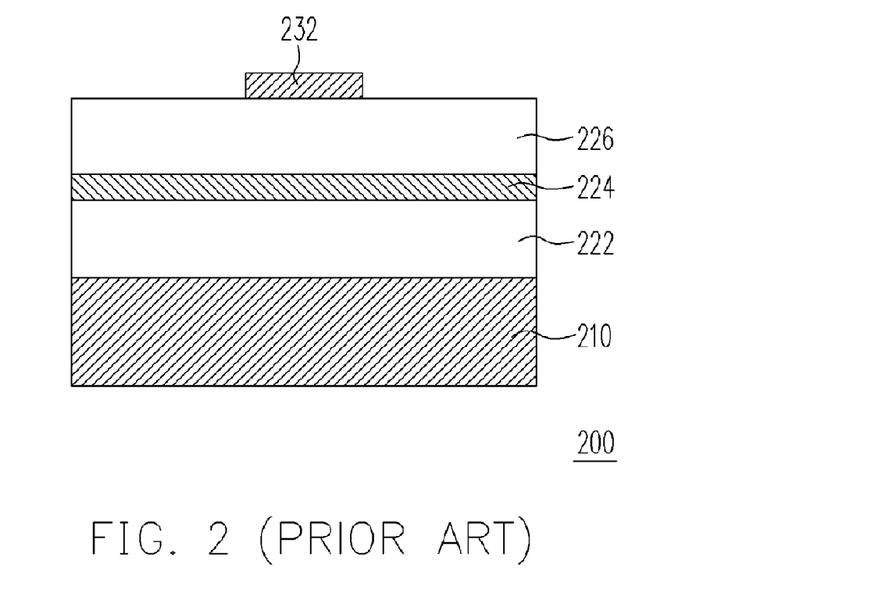
FIG. 2 is another schematic cross-sectional view of a conventional LED.

FIG. 2 is another schematic cross-sectional view of a conventional LED. Referring to FIG. 2, a conventional LED 200 includes a conductive substrate 210, a doped semiconductor layer 222, a light-emitting layer 224 and a doped semiconductor layer 226. Wherein, the doped semiconductor layer 222 is disposed on the substrate 210, while the light-emitting layer 224 is disposed between the doped semiconductor layer 222 and the doped semiconductor layer 226.

Similarly, a bonding pad 232 is usually disposed on the doped semiconductor layer 226 and the bonding pad 232 serves as the same function as the bonding pad 132. However, the conductive substrate 210 is conductive. Therefore, when the conventional LED 200 is disposed on a circuit board or other carriers, the circuit board 210 can be electrically connected to the circuit board directly through the conductive wires disposed on the bonding pad 232 (not shown in the figure).

In the above-described two conventional LEDs, the internal temperature thereof would gradually rise as the time of luminescence increases, then gradually bringing down the luminous efficiency. Furthermore, a crowding effect would take place near the bonding pad when driven, which might damage the bonding pad or the adjacent semiconductor layer, bringing a halt to the LED normal operation.

SUMMARY OF THE INVENTION

Based on the above, an object of the present invention is to provide a LED structure having better luminous efficiency and heat dissipation efficiency.

Another object of the present invention is to provide a manufacturing method of a LED structure to produce a LED structure having higher dissipation efficiency.

Another object of the present invention is to provide a manufacturing method of a LED structure to produce a LED structure having better luminous efficiency.

Based on the above-described objects or the others, the present invention provides a LED structure, which includes an epitaxy substrate, a semiconductor layer, a first bonding pad and a second bonding pad. Wherein, the epitaxy substrate has a through hole and the semiconductor layer is disposed on the epitaxy substrate. Besides, the semiconductor layer includes a first type doped semiconductor layer, a light-emitting layer and a second type doped semiconductor layer, wherein the first type doped semiconductor layer is disposed on the epitaxy substrate and the light-emitting layer is disposed between the first type doped semiconductor layer and the second type doped semiconductor layer. The first bonding pad is disposed in the through hole and electrically connected to the first type doped semiconductor layer, while the second bonding pad is disposed on the second type doped semiconductor layer of the semiconductor layer.

According to the embodiment of the present invention, the material of the above-described epitaxy substrate can be silicon (Si), glass, gallium arsenide (GaAs), gallium nitride (GaN), aluminum gallium arsenide (AlGaAs), gallium phosphide (GaP), silicon carbide (SiC), indium phosphide (InP), boron nitide (BN), aluminum oxide (AlO) or aluminum nitride (AlN).

According to the embodiment of the present invention, the above-described first type doped semiconductor layer, light-emitting layer and second type doped semiconductor layer can be divided into island-like structures.

According to the embodiment of the present invention, the LED structure further includes a buffer layer disposed between the substrate and the semiconductor layer.

According to the embodiment of the present invention, the above-described first type doped semiconductor layer can be an N-type doped semiconductor layer, while the second type doped semiconductor layer can be a P-type doped semiconductor layer. Alternatively, the above-described first type doped semiconductor layer can be a P-type doped semiconductor layer, while the second type doped semiconductor layer can be an N-type doped semiconductor layer.

According to the embodiment of the present invention, the above-described light-emitting layer is an N-type doped semiconductor layer, or a P-type doped semiconductor layer.

According to the embodiment of the present invention, the material of the above-described first bonding pad can be gold, copper or nickel.

Based on the above-described objects or the others, the present invention provides a LED structure, which includes a transfer substrate, a bonding layer, a semiconductor layer, a first bonding pad and a second bonding pad. Wherein, the transfer substrate has a through hole and the bonding layer is disposed between the transfer substrate and the semiconductor layer. Besides, the semiconductor layer includes a first type doped semiconductor layer, a light-emitting layer and a second type doped semiconductor layer, wherein the first type doped semiconductor layer is disposed on the bonding layer and the light-emitting layer is disposed between the first type doped semiconductor layer and the second type doped semiconductor layer. The first bonding pad is disposed in the through hole and electrically connected to the first type doped semiconductor layer through the bonding layer, while the second bonding pad is disposed on the second type doped semiconductor layer of the semiconductor layer.

According to the embodiment of the present invention, the material of the above-described bonding layer can be tin (Sn), Indium (In), gold-tin alloy (AuSn), lead-indium alloy (PbIn), gold-germanium alloy (AuGe), aluminum-germanium alloy (AlGe) or silver paste (Ag paste).

According to the embodiment of the present invention, the LED structure further includes an ohmic contact layer disposed between the bonding layer and the semiconductor layer. Besides, the LED structure further includes a reflection layer disposed between the ohmic contact layer and the bonding layer.

According to the embodiment of the present invention, the above-described first type doped semiconductor layer, light-emitting layer and second type doped semiconductor layer can be divided into island-like structures.

According to the embodiment of the present invention, the above-described first type doped semiconductor layer can be an N-type doped semiconductor layer, while the second type doped semiconductor layer can be a P-type doped semiconductor layer. Alternatively, the above-described first type doped semiconductor layer can be a P-type doped semiconductor layer, while the second type doped semiconductor layer can be an N-type doped semiconductor layer.

According to the embodiment of the present invention, the above-described light-emitting layer is an N-type doped semiconductor layer, or a P-type doped semiconductor layer.

According to the embodiment of the present invention, the material of the above-described first bonding pad can be gold, copper or nickel.

Based on the above-described objects or the others, the present invention provides a manufacturing method of a LED structure, which includes the following steps. First, a first doped semiconductor layer, a light-emitting layer and a second doped semiconductor layer are formed on an epitaxy substrate. In the epitaxy substrate, a through hole is formed, wherein the through hole exposes a partial area of the first doped semiconductor layer. Afterwards, in the through hole, a first bonding pad is formed and the first bonding pad is electrically connected to the first doped semiconductor layer. On the second doped semiconductor layer, a second bonding pad is further formed.

According to the embodiment of the present invention, the method for forming the through hole in the epitaxy substrate is can be a dry etching process or a wet etching process.

According to the embodiment of the present invention, the method for forming the through hole in the epitaxy substrate can be a laser drilling process.

According to the embodiment of the present invention, the method for forming the above-described second bonding pad can be a plating process.

According to the embodiment of the present invention, prior to forming the first doped semiconductor layer, a buffer layer is further formed on the epitaxy layer.

According to the embodiment of the present invention, prior to forming the second bonding pad, a patterning process is further performed on the first doped semiconductor layer, the light-emitting layer and the second doped semiconductor layer, so that the island-like structures are formed.

Based on the above-described objects or the others, the present invention provides a manufacturing method of a LED structure, which includes the following steps. First, a first doped semiconductor layer, a light-emitting layer and a second doped semiconductor layer are sequentially formed on an epitaxy substrate. On the second doped semiconductor layer, a bonding layer is formed, and then a transfer substrate is disposed on the bonding layer. In the transfer substrate, a through hole is formed and the through hole exposes a partial area of the bonding layer. Afterwards, in the through hole, a first bonding pad is formed, wherein the first bonding pad is electrically connected to the second doped semiconductor layer through the bonding layer. After removing the epitaxy substrate, a second bonding pad is formed on the first doped semiconductor layer.

According to the embodiment of the present invention, the method for forming the through hole in the transfer substrate can be a dry etching process or a wet etching process.

According to the embodiment of the present invention, the method for forming the through hole in the transfer substrate can be a laser drilling process.

According to the embodiment of the present invention, the method for forming the above-described first bonding pad can be a plating process.

According to the embodiment of the present invention, the method for removing the above-described epitaxy layer can be a laser lift-off process.

According to the embodiment of the present invention, prior to forming the first doped semiconductor layer, a buffer layer is further formed on the epitaxy layer.

According to the embodiment of the present invention, prior to forming the bonding layer, an ohmic contact layer is formed on the second doped semiconductor layer, and then a reflection layer is formed on the ohmic contact layer.

According to the embodiment of the present invention, prior to forming the above-described second bonding pad, a patterning process is further performed on the first doped semiconductor layer, the light-emitting layer and the second doped semiconductor layer, so that the island-like structures are formed.

Since bonding pads are formed on the epitaxy substrate or the transfer substrate, which is capable of increasing the dissipation efficiency, the LED structure of the present invention has better luminous efficiency. Besides, according to the present invention, the LED structure is moved to a transfer substrate, which is easier to be processed. As a result, a higher production yield is achieved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

The First Embodiment

Figure 3A:
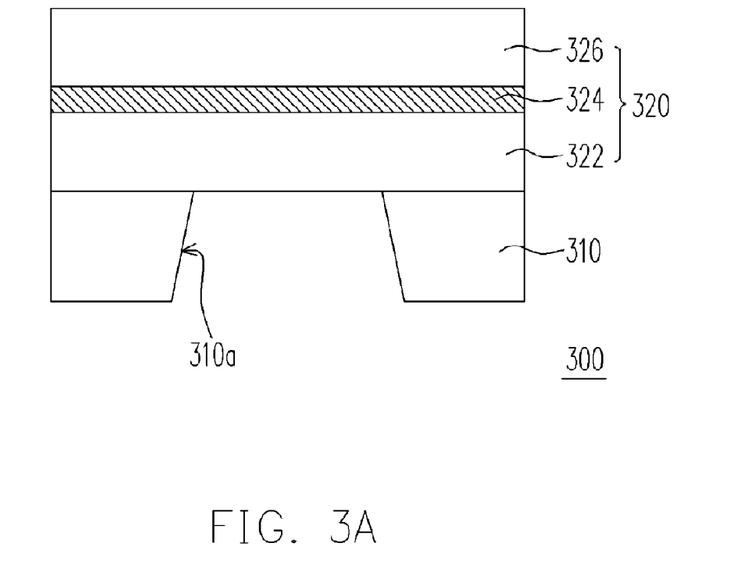
FIG. 3A-3B are schematic cross-sectional views showing a manufacturing method of a LED structure according to the first embodiment of the present invention.
Figure 3B:
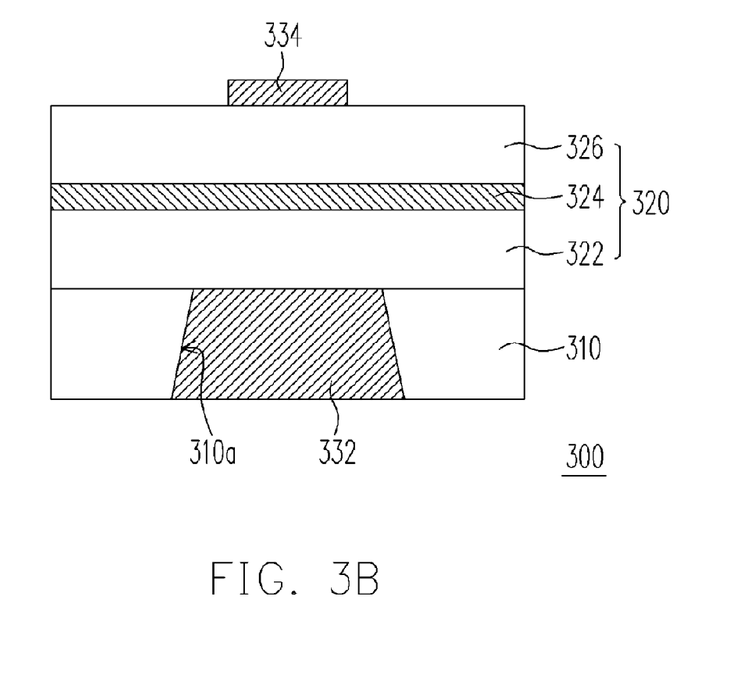

FIG. 3A-3B are schematic cross-sectional views showing a manufacturing method of a LED structure according to the first embodiment of the present invention. Referring to FIG. 3A, the manufacturing method of a LED structure of the embodiment includes the following steps. First, an epitaxy substrate 310 is provided, and then a doped semiconductor layer 322, a light-emitting layer 324 and a doped semiconductor layer 326 are sequentially formed on the epitaxy substrate 310.

Next, in the epitaxy substrate 310, a through hole 310a is formed and the through hole 310a exposes a partial area of the doped semiconductor layer 322. The method for forming the through hole 310a can be a dry etching process or a wet etching process. If the dry etching process is performed, the steps for forming the through hole 310a can be by forming a patterned photoresist layer (not shown) on the epitaxy substrate 310, and conducting an etching process on the epitaxy substrate 310. In another embodiment, the method for forming a through hole 310a can be a laser drilling process or other drilling process onto the epitaxy substrate.

Referring to FIG. 3B, a bonding pad 332 is formed in the through hole 310a and the through hole 310a is electrically connected to the doped semiconductor layer 322. The method for forming the bonding pad 332 in the through hole 310a can be a plating, deposition, printing or other hole-filling technology. Then, on the doped semiconductor layer 326, a bonding pad 334 is formed, so that the LED structure 300 is completely fabricated. The steps for forming the bonding pad 334 can be by forming a conductive material layer (not shown) on the doped semiconductor layer 326, and conducting a patterning process on the conductive material layer to form the bonding pad 334.

Note that the embodiment doesn't limit the order of forming the bonding pads 332 and 334. In fact, the bonding pad 334 can be formed first, then the bonding pad 332. The detail of the LED structure 300 is described hereafter.

Referring to FIG. 3B, the LED structure 300 includes an epitaxy substrate 310, a semiconductor layer 320 and bonding pads 332 and 334. Wherein, the epitaxy substrate 310 has a through hole 310a and the bonding pad 332 is disposed in the through hole 310a. Besides, the material of the above-described epitaxy substrate 310 can be semiconductor or non-semiconductor, such as silicon (Si), glass, gallium arsenide (GaAs), gallium nitride (GaN), aluminum gallium arsenide (AlGaAs), gallium phosphide (GaP), silicon carbide (SiC), indium phosphide (InP), boron nitride (BN), aluminum oxide (AlO) or aluminum nitride (AlN). The material of the bonding pad 332 can be gold, copper, nickel, alloy, metal or other conductive materials.

The semiconductor layer 320 is disposed on the epitaxy substrate 310 and includes a doped semiconductor layer 322, a doped semiconductor layer 326 and a light-emitting layer 324 disposed between the two layers 322 and 326. If the doped semiconductor layer 322 is an N-type doped semiconductor layer, the doped semiconductor layer 326 is a P-type doped semiconductor layer. Otherwise, if the doped semiconductor layer 322 is a P-type doped semiconductor layer, the doped semiconductor layer 326 is an N-type doped semiconductor layer. The material of the light-emitting layer 324 is, for example, a material mainly made of Groups III-V elements with multiple-quantum-well structure (MQW structure), while the light-emitting layer 324 can be an N-type doped semiconductor layer or a P-type doped semiconductor layer.

Compared with the prior art (as shown in FIG. 1), as current flows from the bonding pad 332 or 334 into the light-emitting layer 324, in the LED structure 300 of the embodiment, there is better current distribution, which helps reduce the risk of damaging the semiconductor layer 320. Besides, in comparison with the prior art (as shown in FIG. 2), since the bonding pad 332 directly contacts the doped semiconductor layer 322 and the doped semiconductor layer 322 is made of a low-resistance material, it is not likely to produce heat as the current passes the bonding pad 332. As a conductive material, the bonding pad 332 can be a medium to conduct the heat inside the LED structure 300 outwards, which contributes to a lower temperature inside the LED structure 300. In short, the characteristics of low-resistance and high-conductivity of the bonding pad contributes to higher luminous efficiency in the LED structure 300 of the embodiment.

The Second Embodiment

Figure 4A:
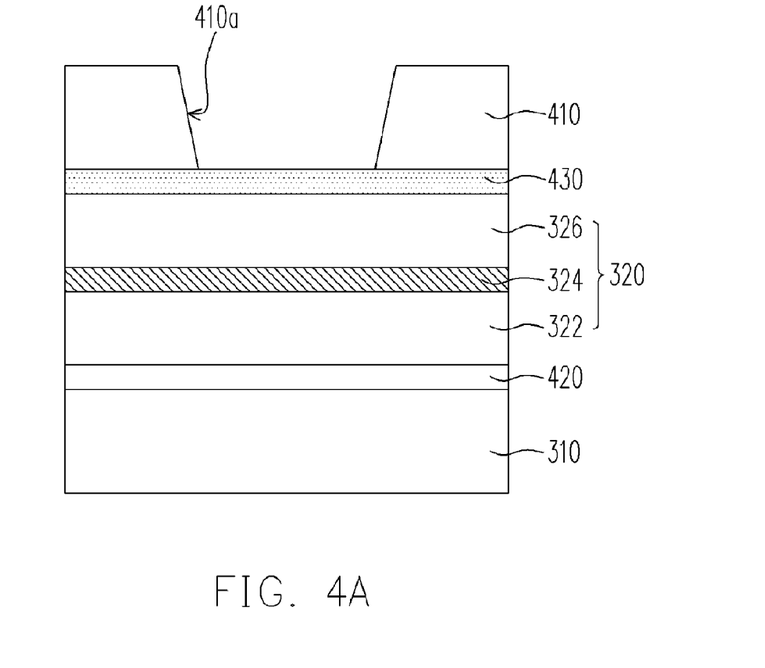
FIG. 4A-4B are schematic cross-sectional views showing a manufacturing method of a LED structure according to the second embodiment of the present invention.
Figure 4B:
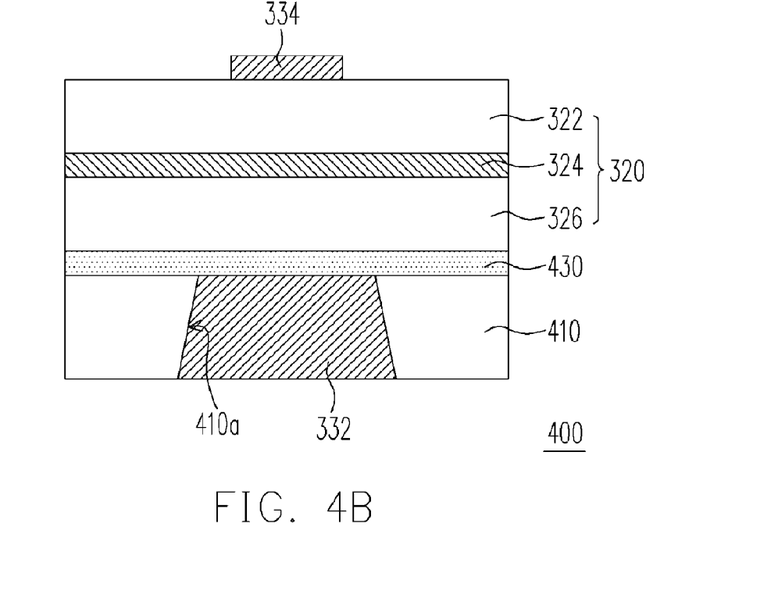

FIG. 4A-4B are schematic cross-sectional views showing a manufacturing method of a LED structure according to the second embodiment of the present invention. Referring to FIG. 4A, the manufacturing method of the LED structure in the embodiment includes the following steps. First, on the epitaxy substrate 310, a doped semiconductor layer 322, a light-emitting layer 324 and a doped semiconductor layer 326 are sequentially formed. To improve the electrical quality of the doped semiconductor layer 322, prior to forming 322, a buffer layer 420 can be alternatively formed on the epitaxy substrate 310. The alternative buffer layer 420 can also be applied in the first embodiment.

Next, on the doped semiconductor layer 326, a bonding layer 430 is formed, and then a transfer substrate 410 is disposed on the bonding layer 430. Note that the bonding layer 430 can be formed on the transfer substrate 410 instead. Afterwards, a through hole 410a is formed in the transfer substrate 410 and the through hole 410a exposes a partial area of the bonding layer 430. The method for forming the through hole 410a is the same as the method for forming the through hole 310a described above.

The material of the above-described bonding layer 430 can be tin (Sn), Indium (In), gold-tin alloy (AuSn), lead-indium alloy (PbIn), gold-germanium alloy (AuGe), aluminum-germanium alloy (AlGe), silver paste (Ag paste) or other conductive materials having adhesion property. The material of the transfer substrate 410 can be a non-conductive material or semiconductor. In an embodiment, the transfer substrate 410 can be a silicon substrate, a glass substrate, a circuit board or other carriers.

Referring to FIG. 4B, in the through hole 410a, a bonding pad 332 is formed, wherein the bonding pad 332 is electrically connected to the doped semiconductor layer 326 through the bonding layer 430. Then, the epitaxy substrate 310 and the buffer layer 420 are removed and a bonding layer 334 is formed on the doped semiconductor layer 322, so that a LED structure 400 is completely formed. The method for removing the above-described epitaxy layer 310 can be a laser lift-off or thermal decomposition process. Besides, the order of forming the bonding pads 334 and 332 can be switched. In other word, after removing the epitaxy substrate 310 and the buffer layer 420, then the bonding pad 334, the through hole 410a and the bonding pad 332 are sequentially formed.

In comparison with the prior art, where a LED structure is formed on an aluminum oxide ($Al_2O_3$) substrate that has low heat conductivity, that is hard to cut and etch, the manufacturing method of a LED structure provided by the present invention is to form a LED structure on a substrate with high heat-conductivity and low-resistance instead, which can significantly increase luminous efficiency and heat dissipation efficiency.

The Third Embodiment

Figure 5A:
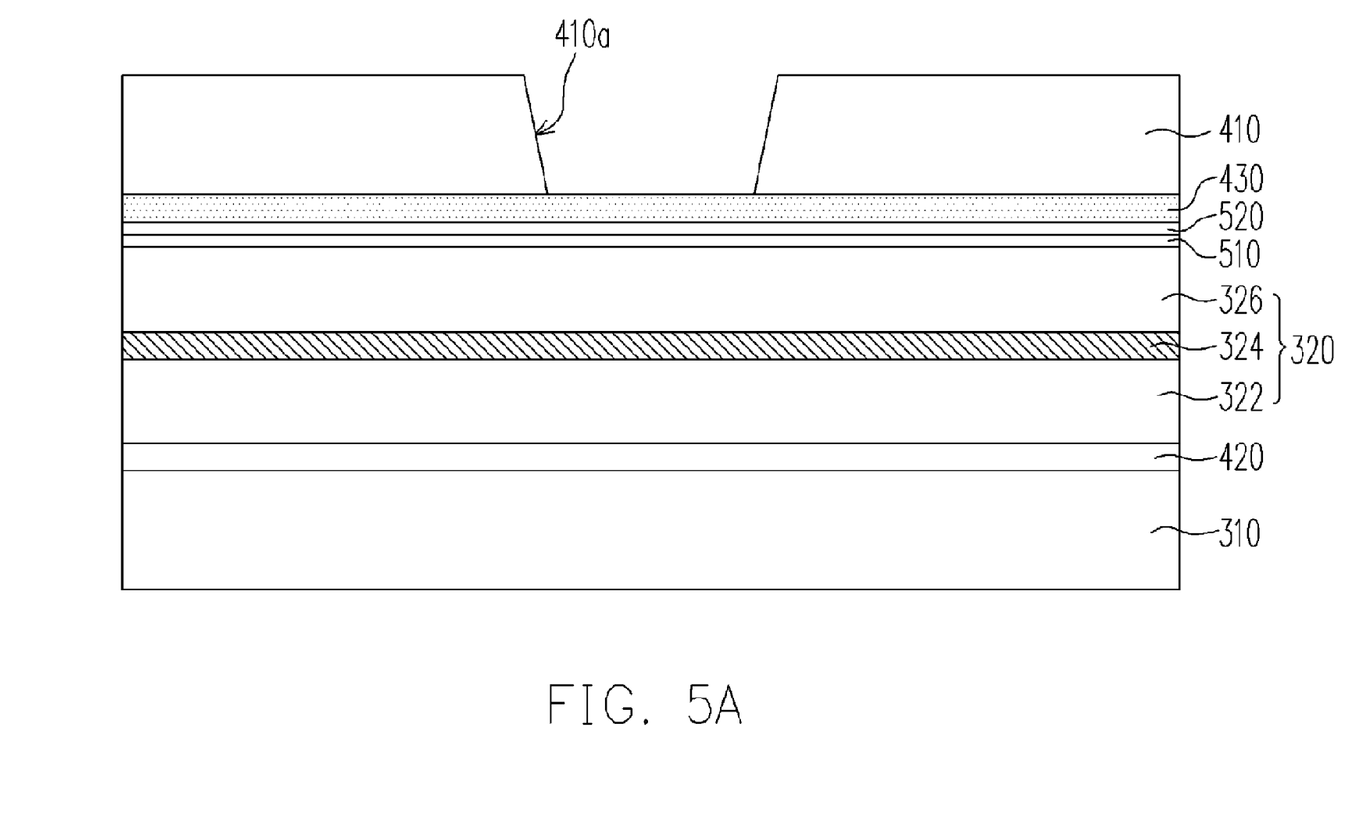
FIG. 5A-5C are schematic cross-sectional views showing a manufacturing method of a LED structure according to the third embodiment of the present invention.
Figure 5B:
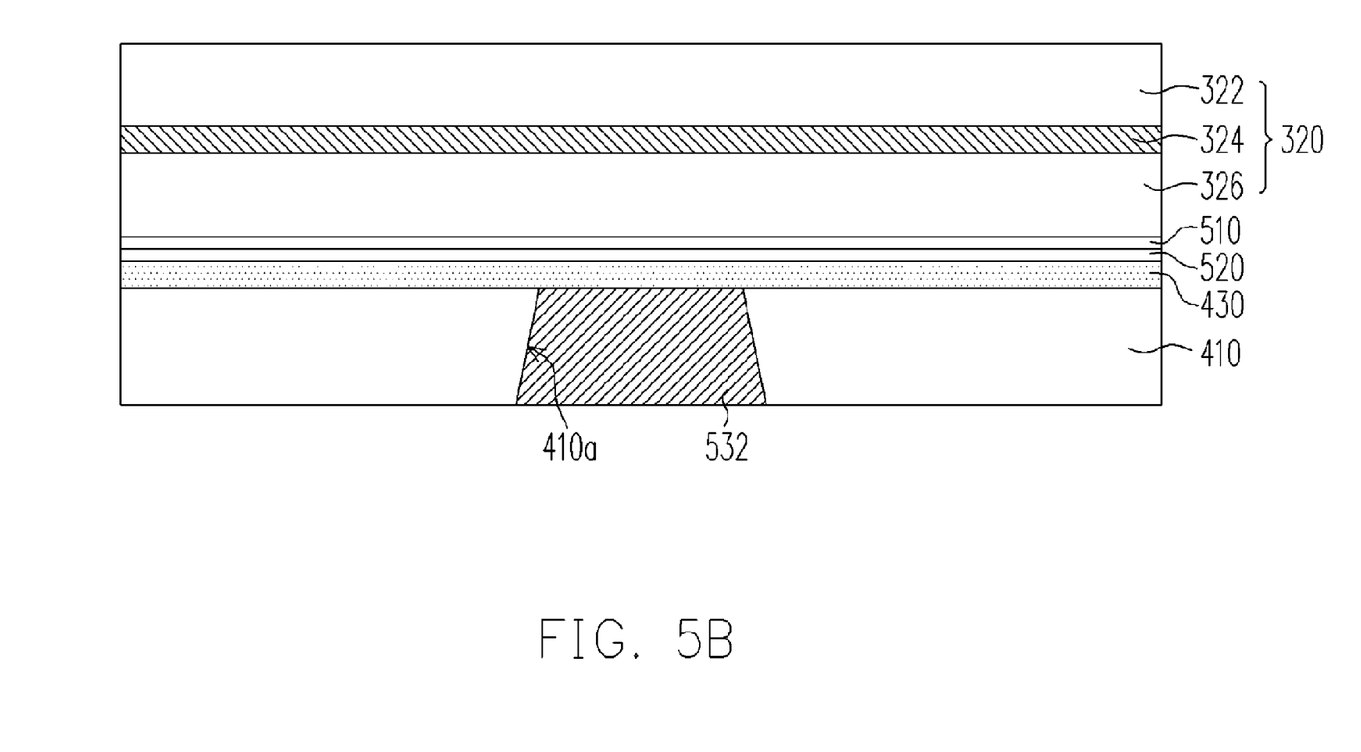
Figure 5C:
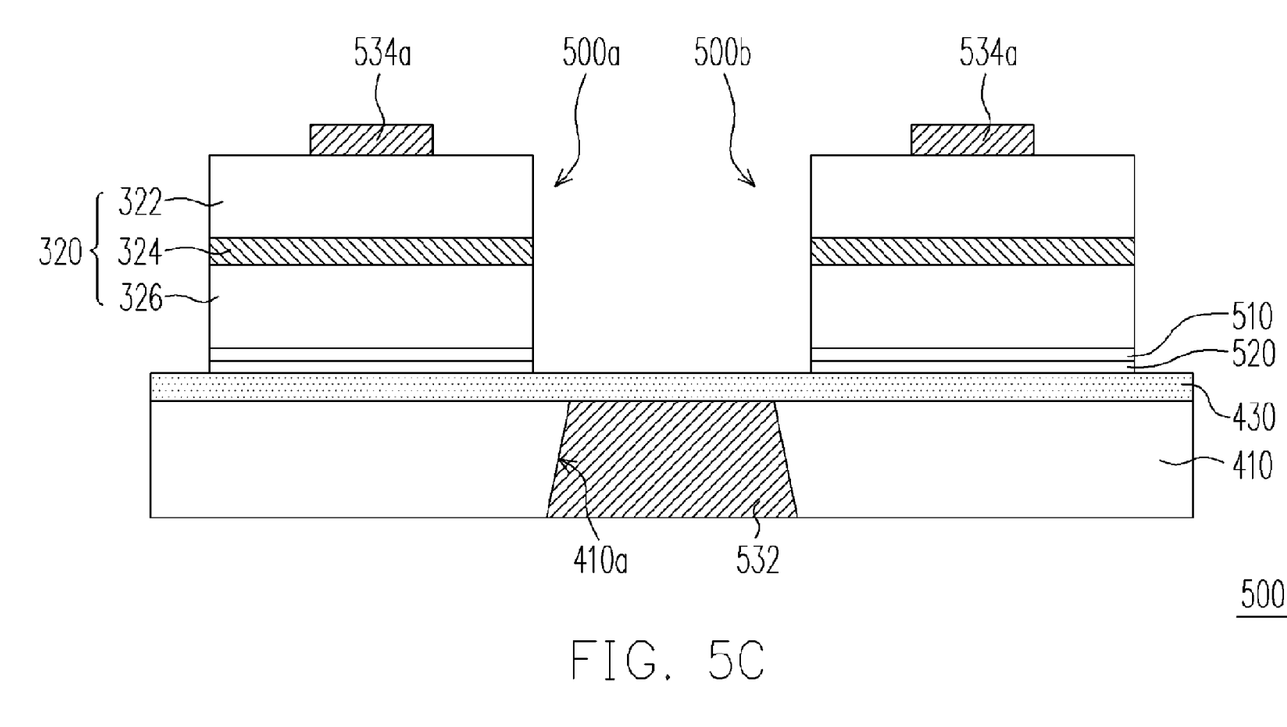

FIG. 5A-5C are schematic cross-sectional views showing a manufacturing method of a LED structure according to the third embodiment of the present invention. Referring to FIG. 5A, to the present embodiment is similar to the second embodiment except that an ohmic contact layer 510 is formed on the doped semiconductor layer 326 after forming the doped semiconductor layer 326 to improve the current conductivity at the interface between the bonding layer 430 and the doped semiconductor layer 326.

To improve the luminous efficiency, after forming the ohmic contact layer 510, a reflection layer 520 is further formed on the ohmic contact layer 510, then a bonding layer 430 is formed on the reflection layer 520 covering the transfer substrate 410 on the bonding layer 430. Afterwards, in the transfer substrate 410, a through hole 410a is formed. Note that the disposition of the ohmic contact layer 510 and the reflection layer 520 can be also applied in the second embodiment.

Referring to FIG. 5B, after forming a bonding pad 532 in the through hole 410a, the epitaxy substrate 310 and the buffer layer 420 are removed. Note that in the embodiment, the step order can be removing the epitaxy substrate 310 and the buffer layer 420 first, then forming the through hole 410a and the bonding pad 532.

Referring to FIG. 5C, a patterning process is conducted on the doped semiconductor layer 322, the light-emitting layer 324 and the doped semiconductor layer 326, so that the island-like structures 500a and 500b are formed. Further, on the doped semiconductor layer 322 of the island-like structures 500a and 500b, a bonding pad 534a and a bonding pad 534b are formed, respectively, and a LED structure is completely formed herein. In other words, light-emitting units (the island-like structures 500a and 500b) are formed on the transfer substrate 410. The light-emitting units (the island-like structures 500a and 500b) are connected in parallel by the bonding layer 430 and the bonding pad 532 to provide stronger luminous intensity. Note that in the embodiment, the island-like structures 500a and 500b, can alternatively be formed first, then the bonding pads 534a and 534b, the through hole 410a and the bonding pad 532 are formed. Besides, the present invention doesn't limit the order of forming the bonding pads 534a, 534b and 532.

In the above description, the island-like structures 500a and 500b are connected in parallel. In fact, the island-like structures 500a and 500b can be connected in series to the other circuit components. Besides, the LED structure 300 in the first embodiment and the LED structure 400 in the second embodiment can also be formed in array arrangement. For example, through holes are formed on the transfer substrate or the epitaxy substrate and in positions corresponding to the semiconductor layers, respectively, then a bonding pad is formed in each through hole. Each the semiconductor layer is solely driven by the corresponding first bonding pad and second bonding pad.

From the above described, it can be seen that the LED structure and the manufacturing method thereof of the present invention have at least the following advantages.

1. In comparison with the prior art, the LED structure of the present invention has better current distribution, capable of reducing risk of damaging the semiconductor layer and increasing the reliability and lifespan thereof.

2. In comparison with the prior art, the LED structure of the present invention has better heat dissipation effect and higher luminous efficiency.

3. In comparison with the prior art, the LED structure of the present invention is moved to a transfer substrate, which can be easily processed. Therefore, the manufacturing method of the LED structure in the present invention can enhance the production yield.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A LED (light emitting diode) structure, comprising:
   an epitaxy substrate, having a through hole;
   a semiconductor layer, disposed on the epitaxy substrate and comprising a first type doped semiconductor layer, a light-emitting layer and a second type doped semiconductor layer, wherein the first type doped semiconductor layer is disposed on the epitaxy substrate and the light-emitting layer is disposed between the first type doped semiconductor layer and the second type doped semiconductor layer;
   a buffer layer disposed between the epitaxy substrate and the semiconductor layer;
   a first bonding pad, disposed in the through hole, wherein the first bonding pad is electrically connected to the first type doped semiconductor layer; and
   a second bonding pad, disposed on the second type doped semiconductor layer of the semiconductor layer.

2. The LED structure as recited in claim 1, wherein the material of the epitaxy substrate comprises silicon (Si), glass, gallium arsenide (GaAs), gallium nitride (GaN), aluminum gallium arsenide (AlGaAs), gallium phosphide (GaP), silicon carbide (SiC), indium phosphide (InP), boron nitride (BN), aluminum oxide (AlO) or aluminum nitride (AlN).

3. The LED structure as recited in claim 1, wherein the first type doped semiconductor layer, the light-emitting layer and the second type doped semiconductor layer are further divided into a plurality of separated island-like structures.

4. The LED structure as recited in claim 1, wherein the first type doped semiconductor layer is an N-type doped semiconductor layer, while the second type doped semiconductor layer is a P-type doped semiconductor layer.

5. The LED structure as recited in claim 1, wherein the first type doped semiconductor layer is a P-type doped semiconductor layer, while the second type doped semiconductor layer is an N-type doped semiconductor layer.

6. The LED structure as recited in claim 1, wherein the light-emitting layer is an N-type doped semiconductor layer.

7. The LED structure as recited in claim 1, wherein the light-emitting layer is a P-type doped semiconductor layer.

8. The LED structure as recited in claim 1, wherein the material of the first bonding pad comprises gold, copper or nickel.

9. A LED (light emitting diode) structure, comprising:
a transfer substrate, having a through hole;
a bonding layer, disposed on the transfer substrate;
a semiconductor layer, disposed on the bonding layer and comprising a first type doped semiconductor layer, a light-emitting layer and a second type doped semiconductor layer, wherein the first type doped semiconductor layer is disposed on the bonding layer and the light-emitting layer is disposed between the first type doped semiconductor layer and the second type doped semiconductor layer;
a first bonding pad, disposed in the through hole, wherein the first bonding pad is electrically connected to the first type doped semiconductor layer through the bonding layer; and
a second bonding pad, disposed on the second type doped semiconductor layer of the semiconductor layer.

10. The LED structure as recited in claim 9, wherein the material of the transfer substrate comprises silicon (Si), glass, gallium arsenide (GaAs), gallium nitride (GaN), aluminum gallium arsenide (AlGaAs), gallium phosphide (GaP), silicon carbide (SiC), indium phosphide (InP), boron nitride (BN), aluminum oxide (AlO) or aluminum nitride (AlN).

11. The LED structure as recited in claim 9, wherein the transfer substrate comprises a circuit board.

12. The LED structure as recited in claim 9, wherein the material of the bonding layer comprises tin (Sn), Indium (In), gold-tin alloy (AuSn), lead-indium alloy (PbIn), gold-germanium alloy (AuGe), aluminum-germanium alloy (AlGe) or silver paste (Ag paste).

13. The LED structure as recited in claim 9, further comprising an ohmic contact layer disposed between the bonding layer and the semiconductor layer.

14. The LED structure as recited in claim 13, further comprising a reflection layer disposed between the ohmic contact layer and the bonding layer.

15. The LED structure as recited in claim 9, wherein the first type doped semiconductor layer, the light-emitting layer and the second type doped semiconductor layer are further divided into a plurality of separated island-like structures.

16. The LED structure as recited in claim 9, wherein the first type doped semiconductor layer is an N-type doped semiconductor layer, while the second type doped semiconductor layer is a P-type doped semiconductor layer.

17. The LED structure as recited in claim 9, wherein the first type doped semiconductor layer is a P-type doped semiconductor layer, while the second type doped semiconductor layer is an N-type doped semiconductor layer.

18. The LED structure as recited in claim 9, wherein the light-emitting layer is an N-type doped semiconductor layer.

19. The LED structure as recited in claim 9, wherein the light-emitting layer is a P-type doped semiconductor layer.

20. The LED structure as recited in claim 9, wherein the material of the first bonding pad comprises gold, copper or nickel.

21. The LED structure as recited in claim 9, wherein the bonding layer is sandwiched between the transfer substrate and the first type doped semiconductor layer.

* * * * *